United States Patent
Chen et al.

(10) Patent No.: US 7,105,361 B2
(45) Date of Patent: Sep. 12, 2006

(54) METHOD OF ETCHING A MAGNETIC MATERIAL

(75) Inventors: Xiaoyi Chen, Foster City, CA (US); Chentsau Ying, Cupertino, CA (US); Padmapani C. Nallan, San Jose, CA (US); Ajay Kumar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 31 days.

(21) Appl. No.: 10/338,059

(22) Filed: Jan. 6, 2003

(65) Prior Publication Data

US 2004/0129361 A1 Jul. 8, 2004

(51) Int. Cl.
*H01L 21/302* (2006.01)

(52) U.S. Cl. .................... 438/3; 438/704; 438/717; 438/734; 438/749; 134/1.2; 134/1.3

(58) Field of Classification Search ............ 134/1.2, 134/1.3; 438/704, 714, 717, 734, 749, 3; 216/22, 57, 68
See application file for complete search history.

(56) References Cited

U.S. PATENT DOCUMENTS

| | | | |
|---|---|---|---|
| 4,760,481 A | 7/1988 | Yuito et al. | 360/123 |
| 5,198,380 A | 3/1993 | Harari | 437/43 |
| 5,221,417 A | 6/1993 | Basavanhally | 156/629 |
| 5,726,480 A | 3/1998 | Pister | 257/415 |
| 6,076,252 A | 6/2000 | Sasaki | 29/603.1 |
| 6,154,346 A | 11/2000 | Sasaki | 360/317 |
| 6,233,813 B1 | 5/2001 | Sasaki et al. | 29/603.14 |
| 6,296,776 B1 | 10/2001 | Sasaki | 216/22 |
| 6,330,743 B1 | 12/2001 | Iijima et al. | 29/603.14 |
| 6,391,216 B1 * | 5/2002 | Nakatani | 216/41 |
| 6,395,639 B1 | 5/2002 | Esry et al. | 438/706 |
| 6,452,742 B1 | 9/2002 | Crue et al. | 360/126 |
| 2001/0010614 A1 | 8/2001 | Sasaki | 360/281.4 |
| 2003/0076095 A1 * | 4/2003 | Jaouen et al. | 324/252 |
| 2003/0077843 A1 * | 4/2003 | Yamauchi et al. | 438/3 |
| 2004/0043620 A1 * | 3/2004 | Ying et al. | 438/710 |

FOREIGN PATENT DOCUMENTS

| | | |
|---|---|---|
| FR | 2801970 | 6/2001 |
| JP | 3-052945 | 3/1991 |
| JP | 5-082481 | 4/1993 |
| JP | 2000322710 | * 11/2000 |
| WO | 01/42805 | 6/2001 |

\* cited by examiner

*Primary Examiner*—George A. Goudreau
(74) *Attorney, Agent, or Firm*—Moser IP Law Group

(57) ABSTRACT

A method of patterning a layer of magnetic material to form isolated magnetic regions. The method forms a mask on a film stack comprising a layer of magnetic material such that the protected and unprotected regions are defined. The unprotected regions are etched in a high temperature environment to form isolated magnetic regions.

22 Claims, 9 Drawing Sheets

METHOD OF ETCHING A MAGNETIC MATERIAL

BACKGROUND OF THE INVENTION

1. Field of the Invention

The present invention generally relates to a method for fabricating devices on semiconductor substrates. More specifically, the invention relates to a method of patterning a layer of magnetic material for fabrication of a magneto-resistive random access memory (MRAM) device.

2. Description of the Related Art

Magneto-resistive random access memory (MRAM) has been developed as a new type of non-volatile memory. Digital information in MRAM is represented by the direction of magnetization of a magnetic material. MRAM has a plurality of memory cells that are interconnected to one another to facilitate storage of information within the MRAM. A memory cell in an MRAM device generally is a multi-layered structure comprising a pair of magnetic layers separated by a tunneling layer. These layers are deposited as overlying blanket films, layer-by-layer, and then featured to form a MRAM device. More specifically, the MRAM device comprises a free (or top) magnetic layer that may change a direction of magnetization and a bottom magnetic layer that has a fixed direction of magnetization. The magnetic layers are separated by a thin tunneling layer formed of a non-magnetic dielectric material such as aluminum oxide ($Al_2O_3$) and the like. The top and bottom magnetic layers may each comprise a plurality of layers of magnetic materials such as permalloy (NiFe), cobalt iron (CoFe), platinum manganese (PtMn), iridium manganese (IrMn) and the like. The top and bottom magnetic layers are also supplied with film electrodes (e.g., comprising conductors such as tantalum (Ta), tantalum nitride (TaN), copper (Cu), and the like) to form an electrical connection for the memory cell to the lines of the MRAM.

Fabrication of a MRAM device comprises etch processes in which one or more layers that comprise a film stack are removed, either partially or in total. The MRAM device comprises the layers that are generally formed from materials that may be easily oxidized, sensitive to corrosion or very thin and as such are difficult to etch with no damage to the stack. In the prior art, during etching a MRAM film stack, the etchants may leave metal-containing residues. Such a problem arises from low etch selectivity and non-volatile nature of by-products that are formed during an etch process. Such residues may accumulate along the sides of the film stack and form a conductive veil-like pattern instead of being suspended in a plasma and eventually exhausted from the processing environment. The conductive residues may cause electrical short-circuits within a MRAM device, e.g., between the magnetic layers separated by the tunnel layer, or may render the MRAM device to operate sub-optimally or not at all.

Therefore, there is a need in the art for a method of patterning magnetic materials for fabrication a magneto-resistive random access memory (MRAM) device.

SUMMARY OF THE INVENTION

The present invention is a method of patterning a layer of magnetic material by forming a mask on a film stack that comprises the layer. The mask defines the layer into protected and unprotected regions. The layer is then etched at a high temperature to form isolated magnetic regions located at the protected regions.

In one embodiment, the method is used for fabrication of a magneto-resistive random access memory (MRAM) device comprising a MRAM film stack that is formed on a semiconductor substrate. The stack comprises a top electrode layer (e.g., Ta, TaN, and the like), a free magnetic layer (e.g., NiFe, CoFe, and the like), a tunneling layer (e.g., $Al_2O_3$ and the like), a magnetic film stack comprising layers of Ru, CoFe, PtMn, IrMn, NiFe, NiFeCr, and the like, a bottom electrode layer (e.g., Ta, TaN, and the like), and a barrier layer (e.g., $SiO_2$ and the like).

The method is a sequence of processes comprising forming a first sacrificial hard mask, plasma etching the top electrode using a chlorine or fluorine chemistry, performing a first residue removal, plasma etching the magnetic film stack at a high temperature (e.g., above 200 degrees Celsius), plasma etching the bottom electrode layer, and performing a second residue removal.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method of patterning a layer of magnetic material. In one embodiment, the invention is used to fabricate a magneto-resistive random access memory (MRAM) device comprising a MRAM film stack that is formed on a semiconductor substrate (also referred to herein as a wafer). The MRAM film stack comprises a top electrode (e.g., tantalum (Ta), tantalum nitride (TaN), and the like), a free magnetic layer (e.g., NiFe, CoFe, and the like), a tunnel layer (e.g., $Al_2O_3$ and the like), a multi-layer magnetic stack comprising layers of NiFe, ruthenium (Ru), CoFe, PtMn, IrMn, NiFeCr and the like, a bottom electrode layer (e.g., Ta, TaN, and the like), and a barrier layer (e.g., $SiO_2$ and the like).

Figure 1A:
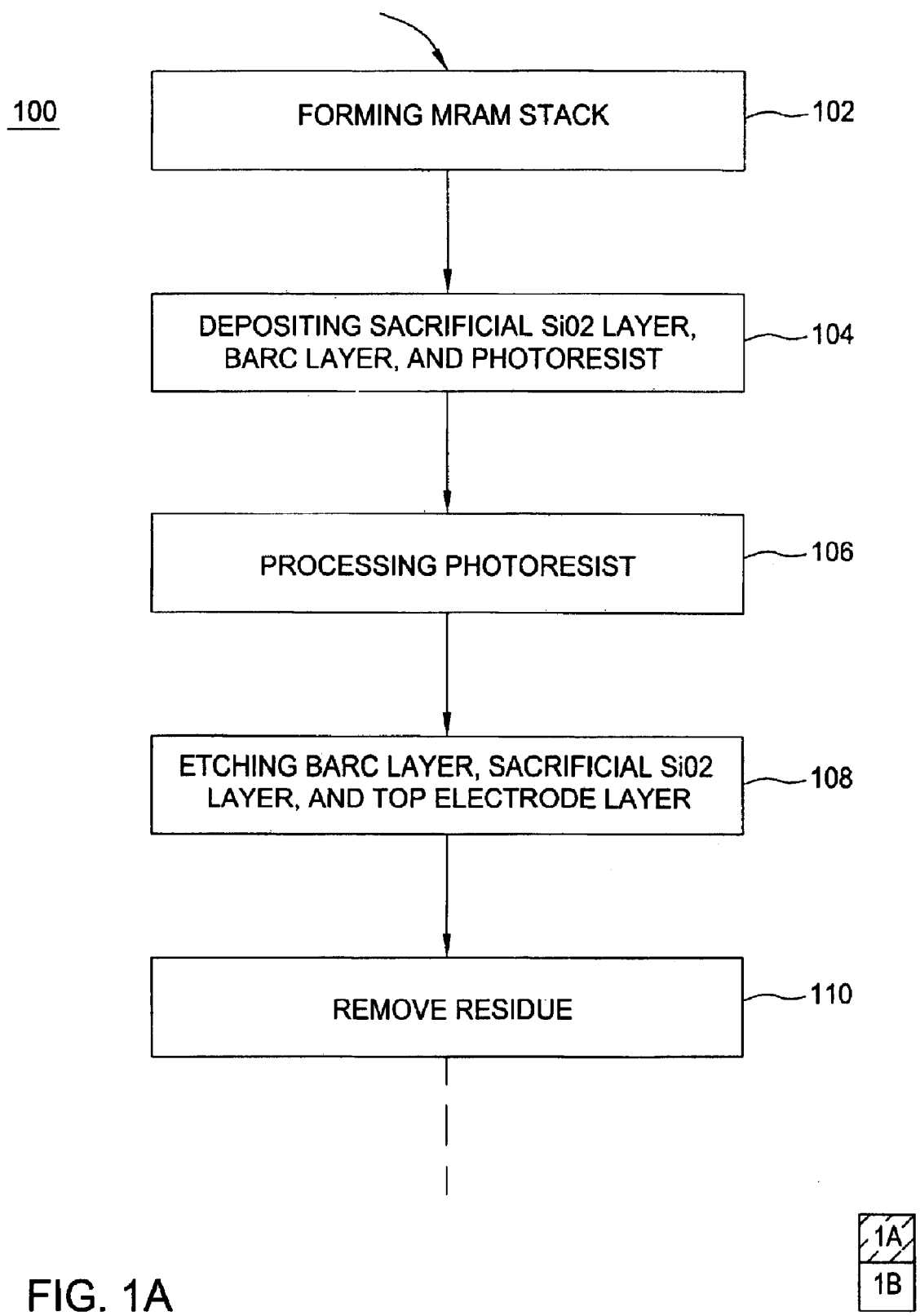
FIGS. 1A and 1B together depict a flow diagram of an example of the present invention.
Figure 1B:
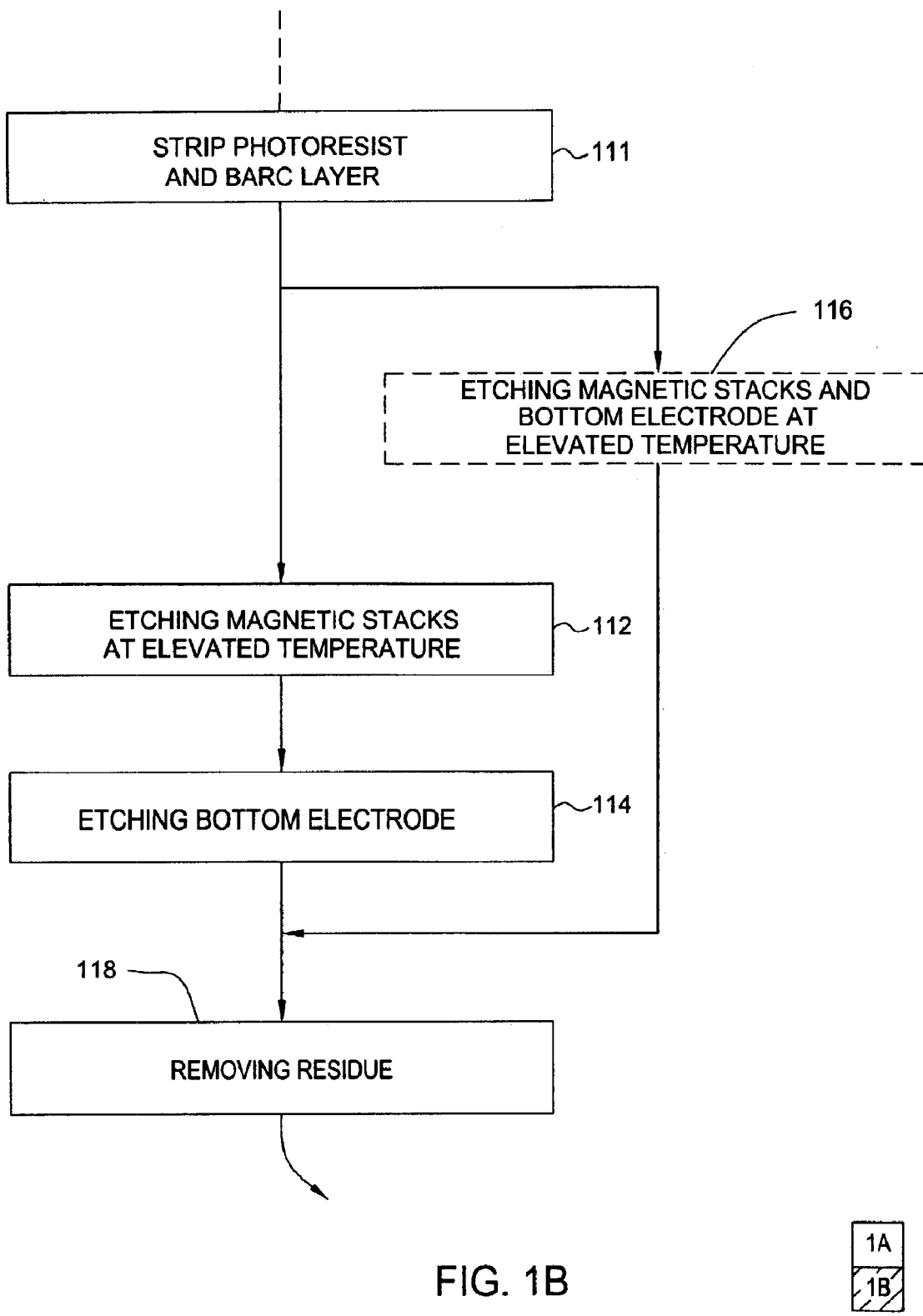

FIGS. 1A and 1B together depict a flow diagram of one embodiment of the inventive method as a sequence 100. The sequence 100 comprises the processes that are performed upon a MRAM film stack during fabrication of the MRAM device.

FIGS. 2A–2H depict a sequence of schematic, cross-sectional views of a substrate comprising a MRAM device being formed therein using the sequence 100. To best understand the invention, the reader should simultaneously refer to FIGS. 1A, 1B, and 2A–2H. The cross-sectional views in FIGS. 2A–2H relate to individual process steps that are used to form the device. Sub-processes and lithographic routines (i.e., exposure and development of photoresist, and the like) are not shown in FIGS. 1A, 1B and FIGS. 2A-2H. The images in FIGS. 2A–2H are not depicted to scale and are simplified for illustrative purposes.

Figure 2A:
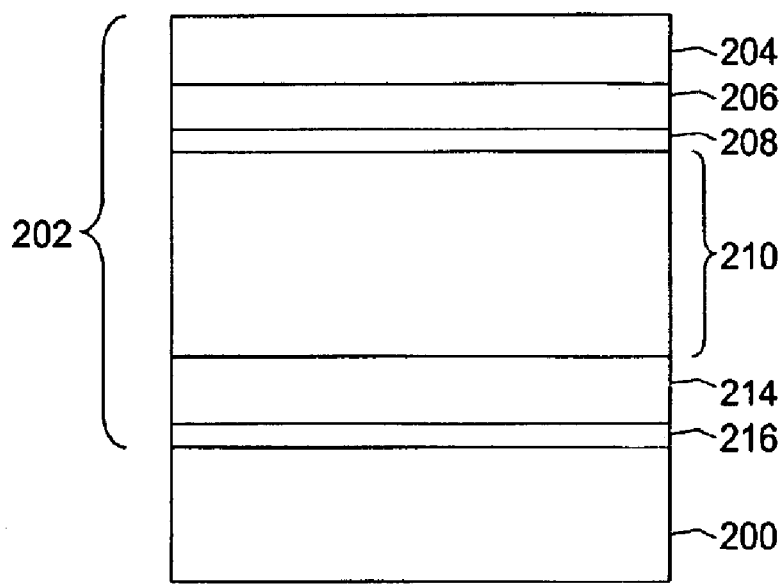
FIGS. 2A–2H depict a sequence of schematic, cross-sectional views of a substrate having a MRAM film stack being formed in accordance with an example of the present invention.

The sequence 100 begins, at step 102, by forming a MRAM film stack 202 on a wafer 200 (FIG. 2A). In one embodiment, the stack 202 comprises a top electrode layer 204, a free magnetic layer 206, a tunneling layer 208, a multi-layer magnetic stack 210, a bottom electrode layer 214, and a barrier layer 216. In one exemplary embodiment, the magnetic stack 210 is a multi-layer stack that comprises layers of CoFe, Ru, CoFe, PtMn, NiFeCr. Alternatively, in the magnetic stack 210, a PtMn may be replaced by an IrMn layer. The tunneling layer 208 is formed, for example, from alumina ($Al_2O_3$) or the like dielectric material to a thickness of about 10–20 Angstroms. The tunnel layer 208 is sandwiched between the free magnetic layer 206 and the magnetic stack 210 to form a magnetic tunnel junction of the MRAM device. The layer 206 is formed, e.g., from materials comprising the nickel and cobalt iron alloys such as CoFe, NiFe, and the like. The layer 206 may consist of one or more sub-layers or a combination of such alloys and generally formed to a total thickness of about 20–100 Angstroms. In one example, the top electrode 204 and the bottom electrode layer 214 are formed from conductors such as tantalum (Ta), tantalum nitride (TaN), and the like to a thickness of about 200–600 Angstroms. It should be understood, however, that the film stack 202 and the magnetic stack 210 may comprise layers that are formed from other materials or layers having a different thickness.

The layers that comprise the stack 202 may be deposited using a vacuum deposition technique such as an atomic layer deposition (ALD), a physical vapor deposition (PVD), a chemical vapor deposition (CVD), evaporation, and the like. Fabrication of the MRAM devices may be performed using the respective processing modules of CENTURA®, ENDURA®, and other semiconductor wafer processing systems available from Applied Materials, Inc. of Santa Clara, Calif. and others.

Figure 2B:
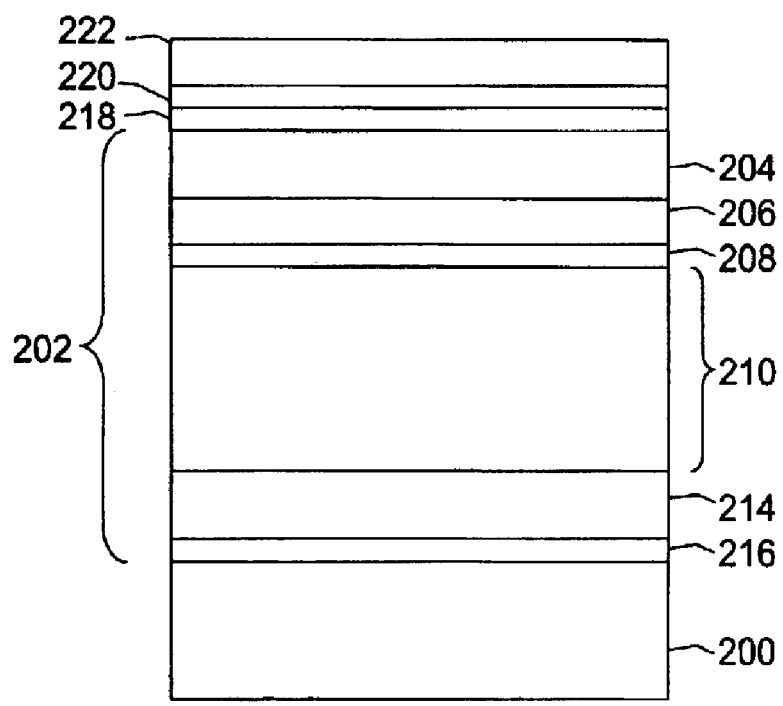

At step 104, a sacrificial layer 218, a bottom anti-reflective coating (BARC) layer 220, and a photoresist layer 222 are sequentially formed atop the film stack 202 (FIG. 2B). The layers 218, 220, and 222 may be formed using conventional deposition (layers 218, 220) and lithographic (layer 222) routines. In one example, the sacrificial layer 218 is formed from silicon dioxide to a thickness of about 2000 Angstroms. The BARC layer 220 is positioned between the photoresist layer 222 and the sacrificial layer 218 and controls the reflection of light from the layer 218 during the exposure of the photoresist. As a feature size is reduced, inaccuracies in a pattern transfer process can arise from optical limitations inherent to the lithographic process such as the light reflection. The BARC layer 220 may be composed, for example, from inorganic materials such as silicon nitride, silicon carbide, and the like, or organic materials such as polyamides and polysulfones and deposited to a thickness of about 700–800 Angstroms. Together, the layers 220 and 222 have a thickness of about 6000 Angstroms. In some applications, the BARC layer may not be necessary. As such, the BARC layer is considered optional.

Figure 2C:
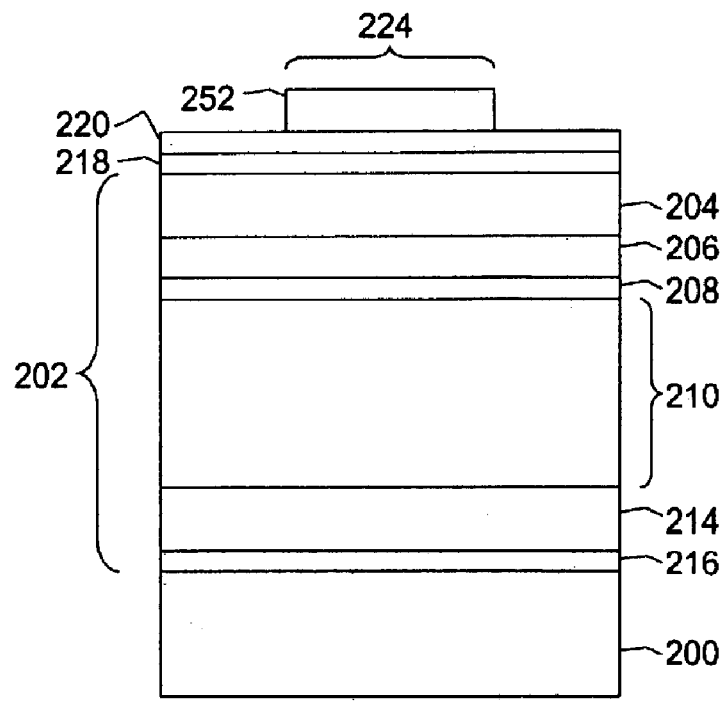

At step 106, the photoresist layer 222 is processed using a conventional lithographic patterning routine. During the routine, the photoresist is exposed through a patterned mask, developed, and the undeveloped portion of the photoresist is removed. The remaining developed photoresist is generally a carbon-based polymer that forms a soft mask 252 on top of the stack 202 in a region 224 of the film stack 202 that is protected during an etch process (FIG. 2C).

Figure 2D:
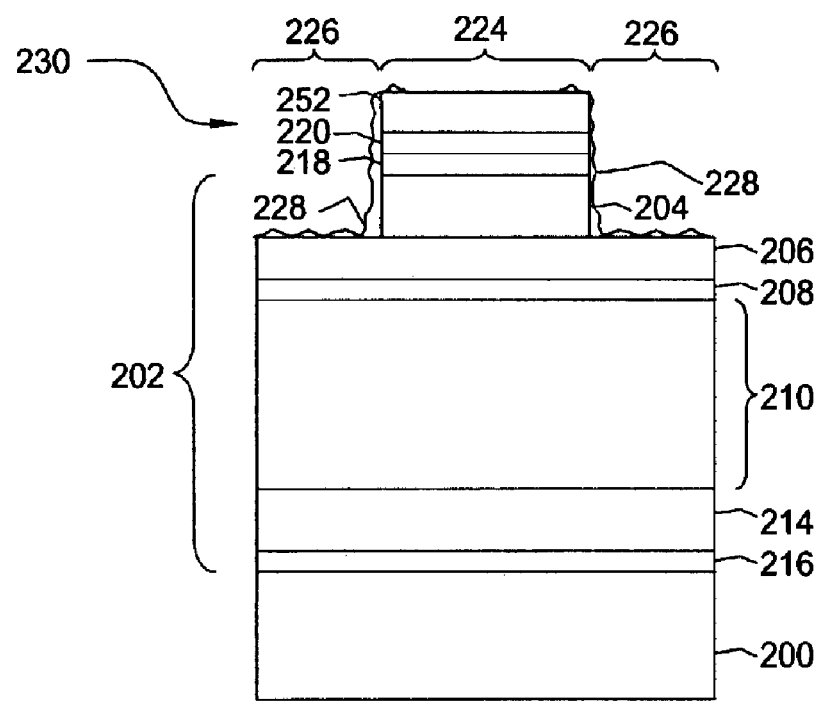

At step 108, the BARC layer 220, the sacrificial layer 218, and the top electrode 204 are plasma etched using either a chlorine-based chemistry (e.g., comprising chlorine ($Cl_2$), hydrogen chloride (HCl), and the like) or fluorine-based chemistry (e.g., comprising carbon tetrafluoride ($CF_4$), trifluoromethane ($CHF_3$), and the like) and an inert gas such as argon (Ar). Step 108 uses the soft mask 252 as an etch mask to form a top electrode 204 and a first hard mask 230 in the protected region 224 and removes the layers 220, 218, and 204 in unprotected regions 226. In one embodiment, step 108 uses the free magnetic layer 206 as an etch stop layer. Alternatively, the process time during step 108 can be terminated upon a certain optical emission occurring (e.g., at wavelength of about 3630 Angstroms), upon a particular duration occurring, or upon some other indicator determining that the top electrode layer 204 has been removed in the regions 226. During step 108, some amount of the etched metal (e.g., tantalum) from the layer 204 combines with components (e.g., chlorine ($Cl_2$) or fluorine(F)) of the etchant, partially etched polymeric material of the soft mask 252, and by-products of the etching process to form a metal-containing residue 228. The residue 228 may form a conductive veil on the side walls of the BARC layer 220 and the sacrificial layer 218 and may also rest elsewhere on the wafer 200 (FIG. 2D).

Step 108 can be performed in a Decoupled Plasma Source (DPS) module of the Centura® system. The DPS module uses a 12.56 MHz inductive plasma source to generate and sustain a high density plasma. A wafer is biased by a 400 kHz bias source. The decoupled nature of the plasma source allows independent control of ion energy and ion density. The DPS module provides a wide process window over changes in source and bias power, etch gas chemistry and pressure, and wafer temperature and uses an endpoint system to determine an end of the etch process. The DPS module is disclosed in detail with respect to FIG. 3 below.

In one embodiment, during etching of the layers 220, 218, and 204 in the DPS module, step 108 supplies 40 to 80 sccm of $CF_4$, 10 to 30 sccm of $CHF_3$, and 40 to 80 sccm of Ar, applies power to an inductively coupled antenna of 200 to 3000 Watts, applies a cathode electrode bias power of 0 to 300 Watts, and maintains a wafer temperature at 0 to 100 degrees Celsius and a pressure in the reaction chamber at 5 to 40 mTorr. Such flow rates define a flow ratio of $CF_4$ to $CHF_3$ in the range of about 3:1. One specific process recipe provides 60 sccm of $CF_4$, 20 sccm of $CHF_3$, and 60 sccm of Ar, applies 1000 Watts to the antenna and 50 Watts to the cathode electrode, and maintains a wafer temperature at 40 degrees Celsius and a pressure in the reaction chamber at 10 mTorr.

At step 110, the conductive residue (veil) 228 is removed using a process that is performed in a wet cleaning module and comprises applying the ammonium hydroxide ($NH_4OH$)/hydrogen peroxide ($H_2O_2$) solvent (e.g., $NH_4OH$/$H_2O_2$/$H_2O$) followed by a rinse in distilled water. An illustrative single wafer cleaning module is described in detail with respect to FIG. 4 below. In one embodiment, the solvent comprises, by weight, about (0.1–10) parts of ammonium hydroxide ($NH_4OH$), (0.1–10) parts of hydrogen peroxide (H$_2$O$_2$), and (1–100) parts of deionized water (H$_2$O). The NH$_4$OH/H$_2$O$_2$/H$_2$O solvent under the trade name of SC1 is available from Rhodia, Inc., Freeport, Tex. and other suppliers. After the wet dip in the SC1 solvent, the substrate 200 is rinsed in distilled water to remove any remaining traces of the solvent. Step 110 applies the solvent at a temperature of about 25 to 65 degrees Celsius for a duration of about 30 to 120 seconds. One specific solvent recipe comprises 1 part of NH$_4$OH, 1 part H$_2$O$_2$, and 10 parts of DI water.

Figure 2E:
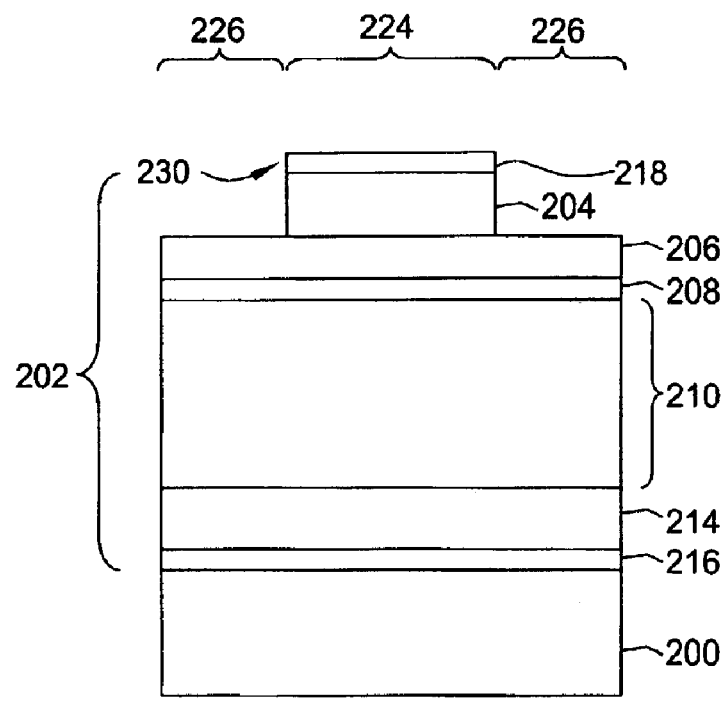

At step 111, the soft mask 252 and BARC layer 220 that has not been consumed during the etching process of step 108 is removed using a conventional photoresist stripping process (FIG. 2E). The stripping process may be performed, for example, in the Advanced Strip and Passivation (ASP) reactor of the CENTURA® system. The ASP reactor is a microwave downstream oxygen plasma reactor in which the plasma is confined to a plasma tube and only reactive neutrals are allowed to enter a process chamber. Such a plasma confinement scheme precludes plasma-related damage of the substrate or circuits formed on the substrate. The ASP reactor provides temperature control of the wafer. The wafer back side may be heated (e.g., radiantly, by quartz halogen lamps) or cooled (e.g., providing an inert gas such as helium to backside of the wafer) to maintain a wafer temperature between 20 to 400 degrees Celsius. A duration of a stripping process generally is between 30 and 120 seconds.

Figure 2F:
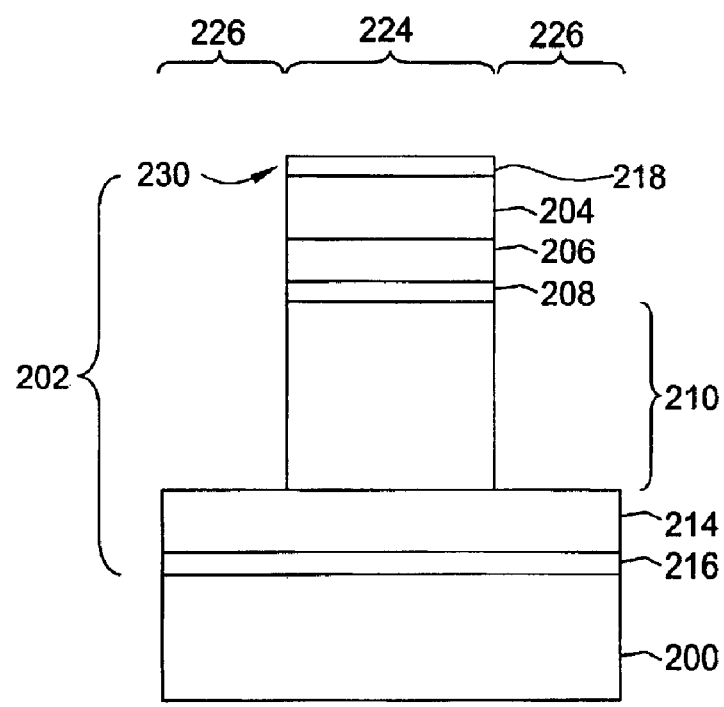

At step 112, the free magnetic layer 206, the tunneling layer 208 and the magnetic film stack 210 are etched using a reactive gas chemistry selected from the group consisting of a halogen-based gas and a carbon monoxide/ammonia (CO/NH$_3$) gas as an etchant at elevated temperature. For the purposes of the subject invention, elevated temperature is understood to be approximately 200 degrees Celsius. The upper limit of the etch temperature is governed by the properties of the aforementioned magnetic stacks 206, 208 and 210 and do not typically exceed 300 degrees Celsius. In one example, the magnetic film stack 210 comprises, from top to bottom, the layers of CoFe, Ru, CoFe, PtMn or IrMn, NiFe, and NiFeCr that are sandwiched between the tunnel layer 208 and the bottom electrode layer 214. In one embodiment, step 112 etches the magnetic film stack 210 using the first hard mask 230 as an etch mask and the bottom electrode 214 as an etch stop layer (FIG. 2F).

When performed in the DPS module, step 112 supplies 10 to 300 sccm of CO and 10 to 300 sccm of NH$_3$, applies the antenna (source) power of 200 to 3000 Watts and the bias power of 50–500 Watts, and maintains a wafer temperature at 100–250 degrees Celsius and a pressure in the reaction chamber of 2 to 50 mtorr. Accordingly, an approximate range of reactive gas flow ratios is from 0.033:1 to 30:1 CO:NH$_3$. One specific process recipe provides 10 sccm of CO and 70 sccm of NH$_3$, applies 1000 Watts to the antenna and 150 Watts to the cathode electrode, and maintains a wafer temperature at 200 degrees Celsius and a pressure in the reaction chamber at 15 mtorr. Halogen based chemistries include gases selected from the group consisting of chlorine/argon/oxygen and boron trichlorides. For example, one chlorine chemistry supplies 20–100 sccm of Cl$_2$, 40–200 sccm of Ar, 20–100 sccm of O$_2$, 200–3000 Watts of source power, 50–500 Watts of bias power, 2–50 mTorr of chamber pressure and 100–250 degrees Celsius of cathode temperature. Accordingly, an approximate range of reactive gas flow ratios is from 0.2:1 to 5.1 Cl$_2$:O$_2$. One specific process recipe provides 20 sccm Cl$_2$, 40 sccm Ar, 20 sccm O$_2$, 5 mTorr, 250 Watts bias, 1000 Watts source and 200 degrees Celsius cathode temperature. For a boron trichloride chemistry, the process supplies: 10–100 sccm of BCl$_3$, 20–200 sccm of Ar, 10–100 sccm of N$_2$, 200–3000 Watts of source power, 50–500 Watts of bias power, 2–50 mTorr of chamber pressure and 100–250 degrees Celsius of cathode temperature. Accordingly, an approximate range of reactive gas flow ratios is from 0.1:1 to 10:1 BCl$_3$:N$_2$. One specific recipe provides: 10 sccm BCl$_2$, 80 sccm Ar, 10 sccm N$_2$, 5 mtorr, 100 Watts bias, 1000 Watts source and 200 degrees Celsius cathode temperature.

During step 112, the by-products of the etching process that would normally have a low volatility have an increased volatility. That is, an enclosed volume, when subjected to an increase in temperature, is also subjected to an increased partial pressure. Such a condition increases the likelihood of suspending by-products in a plasma and subsequent exhausting of same from the volume rather than the by-products forming residue and veil-like structures. The increased temperature also increases the chemical reactivity between the etchant gases and the material(s) being etched thereby creating a cleaner and more complete etching of the magnetic stacks 206, 208 and 210.

Figure 2G:
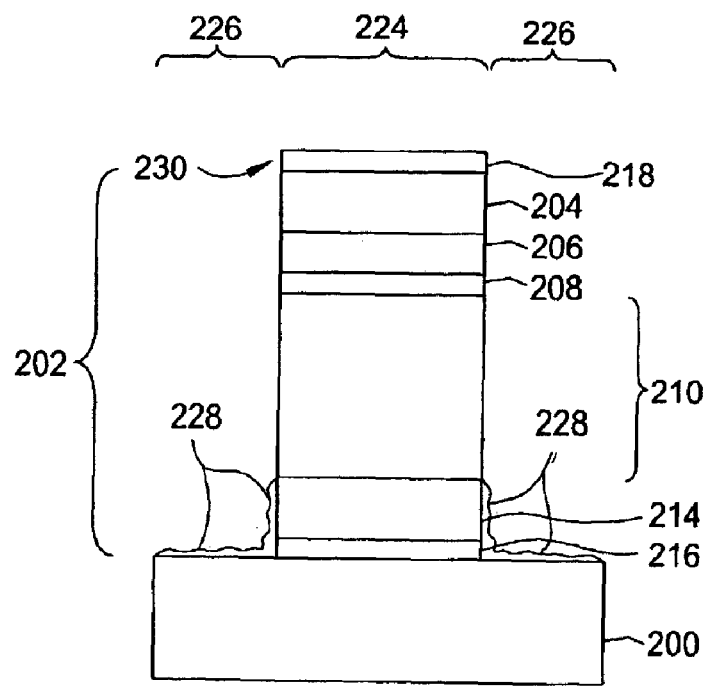

At step 114, the bottom electrode layer 214 and the barrier layer 216 are plasma etched using a Cl$_2$ based etchant such as Cl$_2$/Ar and the like. In one embodiment, using the DPS module, step 114 etches the bottom electrode layer 214 and the barrier layer 216 using the first hard mask 230 as an etch mask (FIG. 2G). The etch process may be performed in the DPS module by supplying 10 to 100 sccm of Cl$_2$ and 10 to 100 sccm of Ar or N$_2$, applying the antenna power of 200 to 3000 Watts and the bias power of 0 to 300 Watts, and maintaining a wafer temperature at 15 to 80 degrees Celsius and a pressure in the reaction chamber at 5 to 40 mTorr. One specific process recipe provides 45 sccm of Cl$_2$ and 45 sccm of N$_2$, applies 700 Watts to the antenna and 50 Watts to the cathode electrode, and maintains a wafer temperature at 80 degrees Celsius and a pressure in the reaction chamber at 10 mTorr. Note that steps 112 and 114 may be performed in-situ, i.e. in the same etch reactor, e.g., in the DPS module, or each step may be performed in a dedicated reactor.

Alternatively, at step 116, the free magnetic layer 206, the tunneling layer 208, the magnetic film stack 210, the bottom electrode layer 214 and the barrier layer 216 may be simultaneously plasma etched using as an etchant reactive gas selected from halogen based chemistry (e.g., Cl$_2$/Ar and the like). Step 116 consecutively etches through the magnetic stacks 206, 208 and 210 and the bottom electrode layer 214 and the barrier layer 216. In one embodiment, step 116, similar to step 114, uses the first hard mask 230 as an etch mask. Step 116 may be performed, for example, in the DPS module using the process recipe as described in reference to step 112.

Figure 2H:
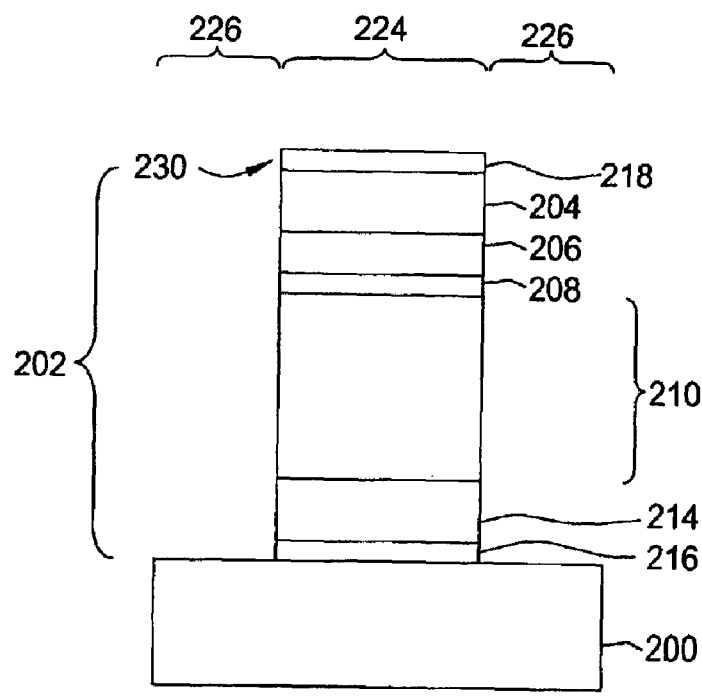

At step 118, any minor metal-containing residues 228 that after step 114 or after step 116 rest on the film stack 202 or elsewhere on the substrate 200 are removed using a process that comprises a wet dip in the NH$_4$OH/H$_2$O$_2$/H$_2$O solvent followed by a rinse in distilled water (FIG. 2H). In one embodiment, step 118 uses the wet cleaning module and the process recipe described in reference to step 110.

Although the foregoing technique is disclosed in the context of fabricating an MRAM device, the method steps may be used individually or in a various combinations to form other structures. For example, a film stack comprising a layer of magnetic material may be pattered by independently to isolate regions of magnetic material using a hard mask and oxidation. Those skilled in the art will recognize that other combinations of the disclosed steps may be used to form various patterns, features and structures.

Figure 3:
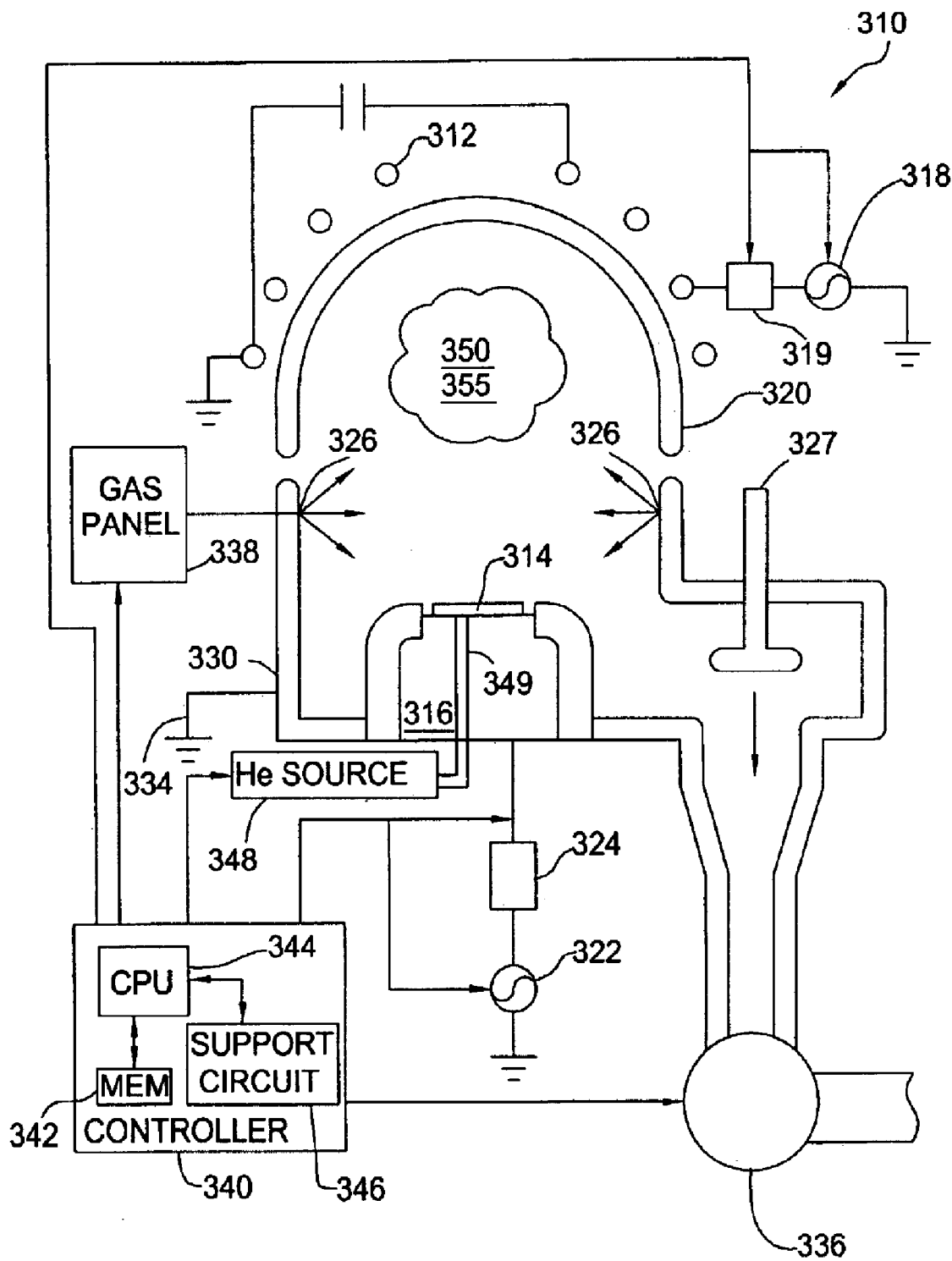
FIG. 3 depicts a schematic, cross sectional view of an etch and oxidation reactor.

One illustrative embodiment of an etch module (reactor) that can be used to perform the etching step(s) of the present invention is depicted in FIG. 3.

FIG. 3 depicts a schematic diagram of the DPS reactor 300 that may be used to accomplish the method of the present invention. The reactor 300 comprises a process chamber 310 having a wafer support pedestal 316 within a conductive body (wall) 330, and a controller 340.

The support pedestal (cathode) 316 is coupled, through a first matching network 324, to a biasing power source 322. The source 322 generally is capable of producing up to 500 W of continuous and pulsed power at a tunable frequency in a range from 50 kHz to 13.56 MHz. In other embodiments, the source 322 may be a DC or pulsed DC source. The wall 330 is capped with a dome-shaped dielectric ceiling 320. Other modifications of the chamber 310 may have other types of ceilings, e.g., a flat ceiling. Typically, the wall 330 is coupled to an electrical ground 334. Above the ceiling 320 is disposed an inductive coil antenna 312. The antenna 312 is coupled, through a second matching network 319, to a plasma power source 318. The source 318 typically is capable of producing up to 3000 W at a tunable frequency in a range from 50 kHz to 13.56 MHz.

A controller 340 comprises a central processing unit (CPU) 344, a memory 342, and support circuits 346 for the CPU 344 and facilitates control of the components of the DPS etch process chamber 310 and, as such, of the etch process, as discussed below in further detail.

In operation, a semiconductor wafer 314 is placed on the pedestal 316 and process gases are supplied from a gas panel 338 through entry ports 326 and form a gaseous mixture 350. The gaseous mixture 350 is ignited into a plasma 355 in the chamber 310 by applying power from the sources 318 and 322 to the antenna 312 and the cathode 316, respectively. The pressure within the interior of the chamber 310 is controlled using a throttle valve 327 and a vacuum pump 336. The temperature of the chamber wall 330 is controlled using liquid-containing conduits (not shown) that run through the wall 330.

The temperature of the wafer 314 is controlled by stabilizing a temperature of the support pedestal 316. In one embodiment, the helium gas from a source 348 is provided via a gas conduit 349 to channels formed by the back of the wafer 314 and grooves (not shown) on the pedestal surface. The helium gas is used to facilitate heat transfer between the pedestal 316 and the wafer 314. During the processing, the pedestal 316 may be heated by a resistive heater (not shown) within the pedestal to a steady state temperature and then the helium gas facilitates uniform heating of the wafer 314. Using thermal control, the wafer 314 is maintained at a temperature of between 10 and 500 degrees Celsius.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the CPU 344 may be one of any form of general purpose computer processor that can be used in an industrial setting for controlling various chambers and sub-processors. The memory 342 is coupled to the CPU 344. The memory 342, or computer-readable medium, may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as software routine. The software routine may also be stored and/or executed by a second CPU (not shown) that is remotely located from the hardware being controlled by the CPU 344.

The software routines are executed after the wafer 314 is positioned on the pedestal 316. The software routines, when executed by the CPU 344, transform the general purpose computer into a specific purpose computer (controller) 340 that controls the chamber operation such that the etching process is performed in accordance with the method of the present invention.

Although the present invention is discussed as being implemented as a software routine, some of the method steps that are disclosed herein may be performed in hardware as well as by the software controller. As such, the invention may be implemented in software as executed upon a computer system, in hardware as an application specific integrated circuit (ASIC), or other type of hardware implementation, or a combination of software and hardware.

Figure 4:
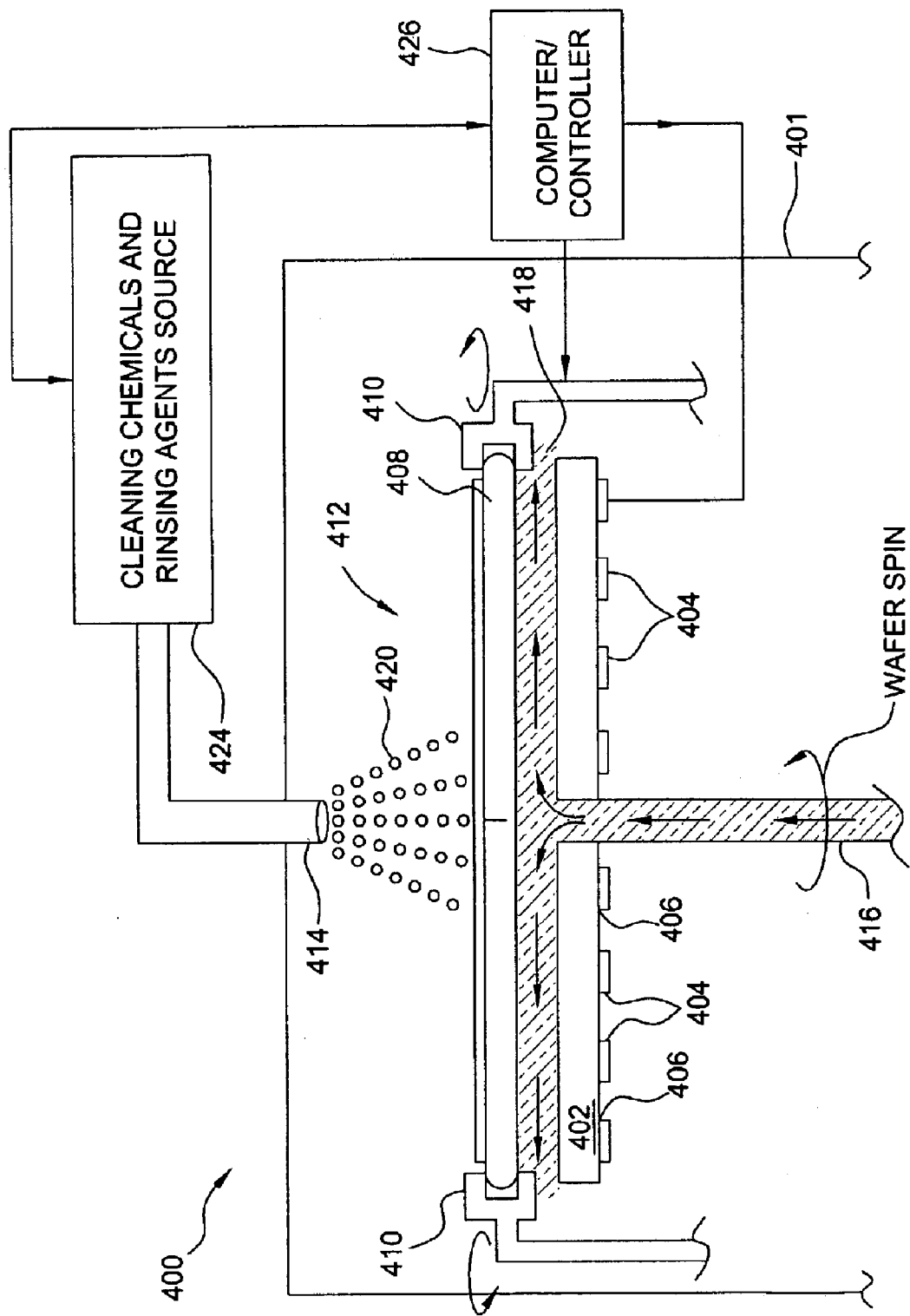
FIG. 4 depicts a schematic, cross sectional view of a wet cleaning module.

One illustrative embodiment of an apparatus that can be used for cleaning and rinsing a substrate in accordance with the present invention is a single substrate wet cleaning module. FIG. 4 depicts a simplified cross-sectional view of an illustrative embodiment of a single substrate wet cleaning module 400. The module 400 is described in detail in U.S. patent application Ser. No. 09/945,454, filed Aug. 31, 2001, which is herein incorporated by reference.

The module 400 applies cleaning chemicals and/or rinsing agents to the top and bottom of a substrate. To enhance the cleaning process, the module 400 uses acoustic or sonic waves to agitate the cleaning chemicals and/or rinsing agents.

The module 400 comprises a chamber 401, a nozzle 414, and a substrate support 412. The substrate support is mounted within the chamber 401 and comprises edge claps 410, plate 402 and a plurality of acoustic or sonic transducers 404. The plate 402 has a shape that is substantially the same as a substrate and supports the plurality of acoustic or sonic transducers 404. The plate 402 is, for example, made of aluminum, but can be formed of other materials such as, but not limited to, stainless steel and sapphire. The plate 402 is coated with a corrosion resistant fluoropolymer such as HALAR or PFA. The transducers 404 are attached to the bottom of the plate 402 using an adhesive, for example, an epoxy 406. In one embodiment of the cleaning module 400, the transducers 404 are arranged in an array that covers substantially the entire bottom surface of plate 402, e.g., approximately 80% of plate 402. The transducers generate sonic waves in the frequency range between 400 kHz and 8 MHz. In one embodiment of the module 400, the transducers are piezoelectric devices.

The plurality of edge clamps 410 retain the substrate 408 face up above the plate 402 to form a gap 418 between the backside of the wafer and the top surface of the plate 402. The gap 418 is approximately 3 mm. Cleaning chemicals and/or rinsing agents are provides to the gap via channel 416. The clamps are rotated to cause the substrate 408 to rotate about its central axis at a rate between 0 and 6000 rpm. In this embodiment of the module 400, the substrate 408 and clamps 410 rotate, while the plate 402 is stationary.

The nozzle 414 sprays cleaning chemicals and/or rinsing agents upon the top of the substrate 408 (i.e., the surface of the substrate comprising features, transistors, or other circuitry). As the nozzle 414 sprays the top of the substrate 408, the same or different cleaning chemicals and/or rinsing agents are supplied to the gap 418 via channel 416 as the substrate is rotated such that the cleaning chemicals and/or rinsing agents flow across the top and bottom surfaces of the substrate.

The nozzle 414 and channel 416 are coupled to a source 424 of cleaning chemicals and/or rinsing agents. The source 424 may be the same for the nozzle 414 and channel 416, or a separate source may be couple to each of the nozzle 414 and channel 416. In the present embodiment of the invention, the module 400 is used to clean the substrate 408 using hydrogen fluoride, ammonium fluoride, hydrogen peroxide, ammonium hydroxide and deionized water. The module 400 is further used to rinse the substrate in deionized water.

A computer controller 426 is generally used to control the operation of the module 400. Specifically, the computer controller 426 controls the rotation of the substrate support 412, the activation of the transducers 404, the supply of cleaning chemicals and/or rinsing agents, and so on.

Figure 5:
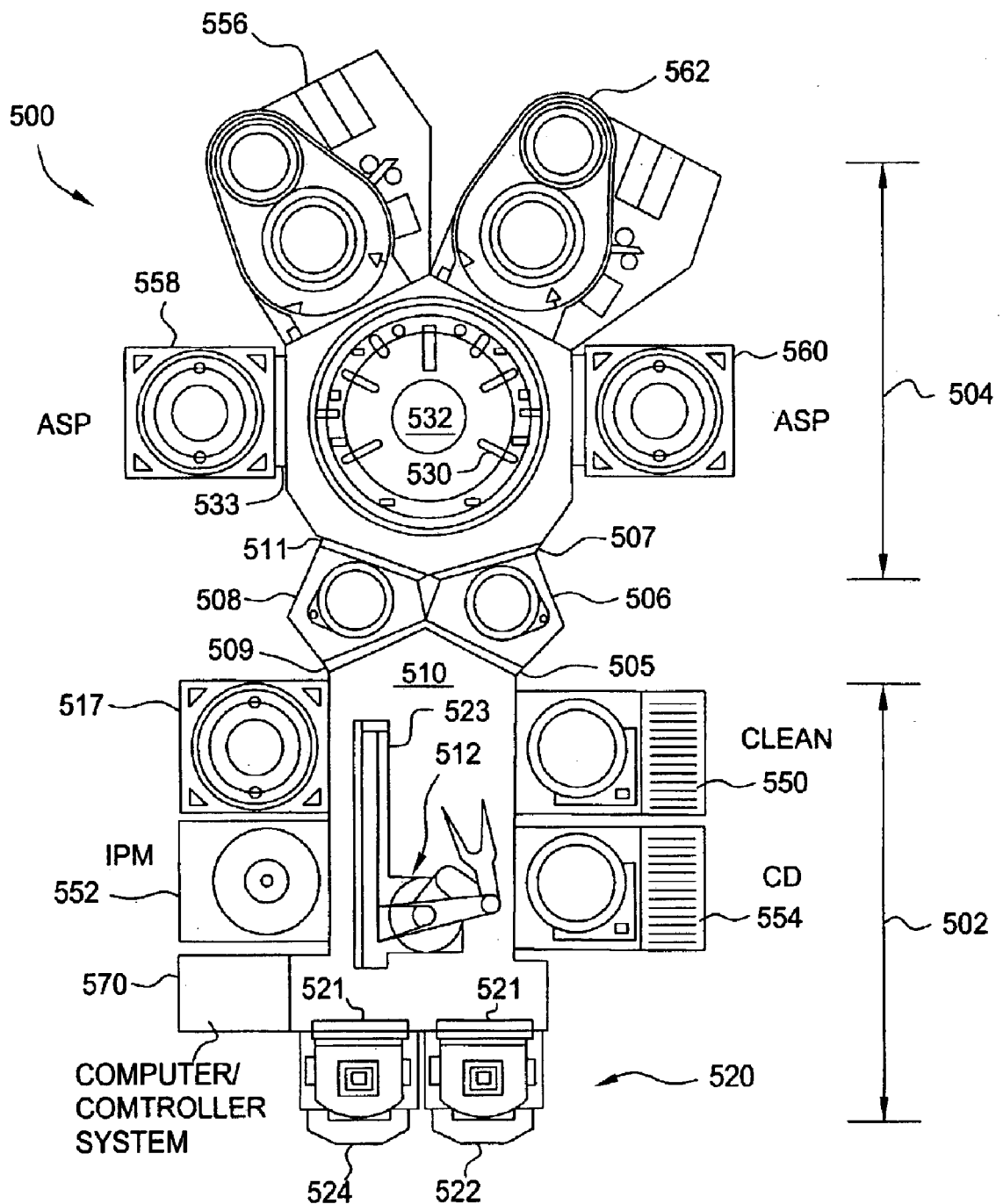
FIG. 5 depicts a schematic, plan view of an integrated platform used to perform the method of the present invention.

The method 100 of the present invention is illustratively performed on an integrated processing platform 500 shown in FIG. 5 that comprises apparatus for performing both atmospheric and sub-atmospheric processing. The platform 500 and the various modules and tools that can be used with such a platform are described in detail in U.S. patent application Ser. No. 09/945,454, filed Aug. 31, 2001, which is herein incorporated by reference.

Depending upon the process modules that are used in the platform 500, the platform 500 (also referred to as a process tool) can be used to perform etching, oxidation, substrate cleaning, photoresist stripping, substrate inspection and the like. The platform 500 comprises an atmospheric platform 502 and a sub-atmospheric platform 504. The sub-atmospheric platform 504 and the atmospheric platform 502 may be coupled together by a single substrate load lock 506 or, as shown in the depicted example, are coupled together by a pair of single load locks 506 and 508. In some applications, the sub-atmospheric and atmospheric platforms 504 and 502 are not coupled together and may be used separately. In one configuration, the stand-alone platform 502 may contain photoresist stripping modules and wet cleaning modules that perform post-etch processing.

The atmospheric platform 502 comprises a central atmospheric transfer chamber 510 containing a substrate handling device 512, such as a robot. Directly attached to the atmospheric transfer chamber 510 is a substrate wet cleaning module 550, an integrated particle monitor 552 and a critical dimension (CD) measuring tool 554, and a photoresist stripping chamber 517. A dry clean module (not shown) can also be attached to the atmospheric transfer chamber 510, if desired. Each module or tool is coupled to the transfer chamber 510 by a separately closable and sealable opening, such as a slit valve. The transfer chamber is maintained at substantially atmospheric pressure during operation. The substrate handling device 512 is able to transfer substrates from one module or tool to another module or tool that is attached to the atmospheric transfer chamber 510. In the embodiment shown, the substrate handling device 512 is a dual blade, single arm, single wrist robot. Other types of robots may be used to access the various modules and tools.

The atmospheric transfer chamber 510 is coupled to at least one substrate input/output module 520 that provides and receives substrates to and from the platform 500. In one embodiment of the platform 500, the module 520 comprises at least one front opening unified pod (FOUP). Two FOUPs 522 and 524 are depicted. The substrate handling device 512 accesses each FOUP through a sealable access door 521. The substrate handling device 512 moves linearly along a track 523 to facilitate access to all of the modules and tools.

The atmospheric transfer chamber 510 is coupled to the pair of load locks 506 and 508 through sealable doors 505 and 509 such that the substrate handling device 512 can access the load locks 506 and 508. The sub-atmospheric platform 504 comprises a central sub-atmospheric transfer chamber 530 and a plurality of process chambers 556, 558, 560, and 562. Sealable doors 507 and 511 respectively couple each load lock 506 and 508 to the sub-atmospheric transfer chamber 530. The sub-atmospheric transfer chamber 530 contains a substrate handing device 532, such as a robot (not shown), that accesses the load locks 506 and 508 as well as the process chambers 556, 558, 560 and 562. The process chambers 556, 558, 560 and 562 are each coupled to the sub-atmospheric transfer chamber 530 via separately closable and sealable openings, such as slit-valves. The process chambers 556, 558, 560 and 562 may comprise one or more etching chambers such as the DPS or DPS II chamber. Additionally, one or more photoresist stripping chambers such as the ASP chamber described above may be used as one or more of the process chambers 556, 558, 560 and 562. As also described above, the ASP chamber, if used, may be located either on the sub-atmospheric platform 504 or the atmospheric platform 502. FIG. 5 shows the sub-atmospheric platform 504 comprising two etch and oxidation chambers 558 and 560 and two photoresist stripping chambers 556 and 562. The sub-atmospheric platform 504 is, for example, a CENTURA platform available from Applied Materials, Inc. of Santa Clara, Calif.

The platform 500 also includes a system computer 570 that is coupled to and controls each module that is coupled to the atmospheric and sub-atmospheric platforms 502 and 504, controls the substrate handling devices 512 and 532, and controls the load locks 506 and 508. Generally, the system computer 570 controls all aspects of operation of the platform 500 either by direct control of the sub-systems, modules, tools and apparatus or by controlling the computers associated with those sub-systems, modules, tools and apparatus. The system computer 570 enables feedback from one module or tool to be used to control the flow of substrates through the platform 500 and/or control the processes or operation of the various modules and tools to optimize substrate throughput.

The MRAM device operates by applying a voltage across the electrodes 204 and 214 to set the direction of the magnetic moments in the free magnetic layer 206. The layer of PtMn is a "pinning" layer that sets (or pins) the direction of the magnetic moments of the magnetic film stack 210 (the "pinned" layer). Depending on whether the direction of moments in the free magnetic layer 206 is aligned with the direction of the pinned layer 210 or is opposed to the direction of the magnetic moments in the pinned layer 210, the electrical current through the MRAM device is either high or low. The establishment of the moment direction in the free magnetic layer 206 is used to store information in an MRAM cell. A plurality of the cells can be arranged to form a MRAM memory array.

Although the forgoing discussion referred to fabrication of the MRAM device, fabrication of the other structures and features used in the integrated circuits and devices can benefit from the invention. The invention can be practiced in other etch semiconductor processing systems where the processing parameters may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. A method of defining an isolated magnetic region in a film stack that comprises a layer of magnetic material the method comprising:
    providing the film stack having a mask that is formed from silicon dioxide and defines protected and unprotected regions of the layers, and
    performing a high temperature etch of the unprotected regions of the layer at a substrate temperature of approximately 100–250 degrees Celsius using $CO/NH_3$ to form the isolated magnetic regions therein.

2. The method of claim 1 wherein the high temperature etch step further comprises:
    supplying about 10 to 300 sccm of CO and 10 to 300 sccm of $NH_3$, maintaining in a reaction chamber a gas pressure at about 2 to 50 mTorr, applying a bias power to a cathode electrode of about 50 to 500 Watts, and applying power to an inductively coupled antenna of about 200 to 3000 Watts.

3. The method of claim 1 wherein the high temperature etch step further comprises:
    supplying 10 sccm of CO and 70 sccm of $NH_3$, maintaining in a reaction chamber a gas pressure at about 15 mTorr, applying a bias power to a cathode electrode of about 150 Watts, and applying power to an inductively coupled antenna of about 1000 Watts.

4. A method of fabricating a magneto-resistive random access memory (MRAM) device from a film stack comprising a top electrode, a free magnetic layer, a tunnel layer, a magnetic film stack, and a bottom electrode that are formed on a semiconductor substrate, comprising:
    (a) depositing a layer of silicon dioxide on the top electrode layer;
    (b) forming a first sacrificial hard mask from the layer of silicon dioxide and etching the top electrode wherein said etching of the top electrode produces a first residue;
    (c) removing the first residue;
    (d) etching the magnetic film stack using the hard mask as an etch mask at a substrate temperature of approximately 100–250 degrees Celsius using a reactive gas selected from the group consisting of a halogen-based gas and a $CO/NH_3$ gas;
    (e) etching the bottom electrode layer, said etching step producing a second residue; and
    (f) removing the second residue.

5. The method of claim 4 wherein the step (d) is performed at a temperature of approximately 200° C.

6. The method of claim 4 wherein:
    the top electrode layer comprises material selected from the group consisting of Ta and TaN;
    the free magnetic layer comprises material selected from the group consisting of NiFe and CoFe;
    the tunnel layer comprises $Al_2O_3$;
    the magnetic film stack comprises layers formed from materials selected from the group consisting of NiFe, Ru, CaFe, PtMn, IrMn and NiFeCr; and
    the bottom electrode layer comprises material selected from the group consisting of Ta and TaN.

7. The method of claim 4 wherein step (d) and step (e) are performed in the same reactor.

8. The method of claim 4 wherein step (b) comprises:
    supplying about 40 to 80 sccm of $CF_4$, 10 to 30 sccm of $CHF_3$, and 40 to 80 sccm of Ar, maintaining in a reaction chamber a gas pressure at about 5 to 40 mTorr, applying a bias power to a cathode electrode of about 0 to 300 Watts, applying power to an inductively coupled antenna of about 200 to 3000 Watts, and maintaining the substrate at a temperature of about 0 to 100 degrees Celsius.

9. The method of claim 4 wherein step (c) further comprises:
    applying a solvent comprising $NH_4OH$, $H_2O_2$, and $H_2O$ to the substrate until the first residue is removed; and
    rinsing the substrate in distilled water.

10. The method of claim 9 wherein the solvent comprises, by weight, about (0.1–10) parts of $NH_4OH$, (0.1–10) parts of $H_2O_2$, and (1–100) parts of $H_2O$, and is applied at a temperature of about 25 to 65 degrees Celsius for a duration of about 30 to 120 seconds.

11. The method of claim 10 wherein the solvent comprises, by weight, 1 part of $NH_4OH$, 1 part of $H_2O_2$, and 10 parts of $H_2O$, and is applied at a temperature of about 25 to 65 degrees Celsius for a duration of about 30 to 120 seconds.

12. The method of claim 9 wherein a plasma is formed from the halogen-based gas and $CO/NH_3$.

13. The method of claim 4 wherein step (d) comprises:
    supplying about 10 to 300 sccm of CO and 10 to 300 sccm of $NH_3$, maintaining in a reaction chamber a gas pressure at about 2 to 50 mTorr, applying a bias power to a cathode electrode of about 50 to 500 Watts, and applying power to an inductively coupled antenna of about 200 to 3000 Watts.

14. The method of claim 4 wherein step (d) further comprises:
    supplying 10 sccm of $CO_2$ and 70 sccm of $NH_3$, maintaining in a reaction chamber a gas pressure at about 15 mTorr, applying a bias power to a cathode electrode of about 150 Watts, and applying power to an inductively coupled antenna of about 1000 Watts.

15. The method of claim 9 wherein step (f) further comprises:
    applying a solvent comprising $NH_4OH$, $H_2O_2$, and $H_2O$ to the substrate and until the second residue is removed; and
    rinsing the substrate in a distilled water.

16. The method of claim 15 wherein the solvent comprises by weight about (0.1–10) parts of $NH_4OH$, (0.1–10) parts of $H_2O_2$, and (1–100) parts of $H_2O$, and is applied at a temperature of about 25 to 65 degrees Celsius for a duration of about 30 to 120 seconds.

17. The method of claim 16 wherein the solvent comprises, by weight, 1 part of $NH_4OH$, 1 part of $H_2O_2$, and 10 parts of $H_2O$, and is applied at a temperature of about 25 to 65 degrees Celsius for a duration of about 30 to 120 seconds.

18. The method of claim 1, wherein the magnetic material comprises at least one of the materials selected from the group consisting of NiFe, CoFe, PtMn, IrMn, Ru and NiFeCr.

19. A method of defining an isolated magnetic region in a film stack that comprises a layer of magnetic material, the method comprising:

providing the film stack having a mask that is formed from silicon dioxide and defines protected and unprotected regions of the layer;

performing a high temperature etch of the unprotected regions of the layer at a substrate temperature of 100–250 degrees Celsius using a halogen-based gas to form the isolated magnetic regions therein; and, maintaining in a reaction chamber a pressure at about 2 to 50 mTorr, applying a bias power to a cathode electrode of about 50 to 500 Watts, and applying power to an inductively coupled antenna of about 200 to 3000 Watts.

20. The method of claim 19, wherein tile high temperature etch is performed at a temperature greater than about 200 degrees Celsius.

21. The method of claim 19, wherein the high temperature etch is performed at a temperature of approximately 200 degrees Celsius.

22. The method of claim 19, wherein the magnetic material comprises at least one of the materials selected from the group consisting of NiFe, CoFe, PtMn, IrMn, Ru and NiFeCr.

* * * * *

UNITED STATES PATENT AND TRADEMARK OFFICE
CERTIFICATE OF CORRECTION

| | | |
|---|---|---|
| PATENT NO. | : 7,105,361 B2 | Page 1 of 1 |
| APPLICATION NO. | : 10/338059 | |
| DATED | : September 12, 2006 | |
| INVENTOR(S) | : Chen et al. | |

It is certified that error appears in the above-identified patent and that said Letters Patent is hereby corrected as shown below:

In column 5, line 51, delete "mtorr" and insert -- mTorr --, therefor.

In column 5, line 57, delete "mtoor" and insert -- mTorr --, therefor.

In column 6, line 9, delete "mtorr" and insert -- mTorr --, therefor.

In column 11, line 12, in Claim 1, after "material" insert -- , --.

In column 11, line 16, in Claim 1, delete "layers," and insert -- layer; --, therefor.

In column 11, line 67, in Claim 6, delete "CaFe" and insert -- CoFe --, therefor.

In column 12, line 28, in Claim 12, delete "claim 9" and insert -- claim 4 --, therefor.

In column 12, line 45, in Claim 15, delete "claim 9" and insert -- claim 4 --, therefor.

In column 14, line 1, in Claim 20, delete "tile" and insert -- the --, therefor.

Signed and Sealed this

Nineteenth Day of December, 2006

JON W. DUDAS
*Director of the United States Patent and Trademark Office*